United States Patent
Tan

(10) Patent No.: US 10,075,286 B1
(45) Date of Patent: Sep. 11, 2018

(54) EQUALIZER FOR LIMITED INTERSYMBOL INTERFERENCE

(71) Applicant: Tektronix, Inc., Beaverton, OR (US)

(72) Inventor: Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/687,364

(22) Filed: Aug. 25, 2017

Related U.S. Application Data

(60) Provisional application No. 62/470,757, filed on Mar. 13, 2017.

(51) Int. Cl.
| | |
|---|---|
| *H04L 25/03* | (2006.01) |
| *H04L 7/033* | (2006.01) |
| *H04L 7/00* | (2006.01) |
| *H04L 1/20* | (2006.01) |

(52) U.S. Cl.
CPC ............ *H04L 7/0331* (2013.01); *H04L 1/205* (2013.01); *H04L 7/0087* (2013.01); *H04L 25/03019* (2013.01); *H04L 25/03853* (2013.01); *H04L 7/0029* (2013.01)

(58) Field of Classification Search
CPC ........................................................ H04L 25/03
USPC ......................................... 375/229, 230, 232
See application file for complete search history.

(56) References Cited

U.S. PATENT DOCUMENTS

| | | | |
|---|---|---|---|
| 2005/0057253 A1* | 3/2005 | Gee .................. | G01R 13/02 324/409 |
| 2005/0267696 A1* | 12/2005 | Yamaguchi ........... | G01R 29/02 702/57 |
| 2006/0045175 A1* | 3/2006 | Draving ................ | H04L 1/205 375/224 |
| 2013/0230131 A1* | 9/2013 | Moore ................. | H04B 1/0032 375/350 |
| 2017/0292977 A1* | 10/2017 | Pickerd ............... | G01R 13/225 |

\* cited by examiner

*Primary Examiner* — Kevin Kim
(74) *Attorney, Agent, or Firm* — Marger Johnson; Andrew J. Harrington

(57) ABSTRACT

Disclosed is a mechanism for limiting Intersymbol Interference (ISI) when measuring uncorrelated jitter in a test and measurement system. A waveform is obtained that describes a signal. Such waveform may be obtained from memory. A processor then extracts a signal pulse from the waveform. The processor selects a window function based on a shape of the signal pulse. Further, the processor applies the window function to the signal pulse to remove ISI outside a window of the window function while measuring waveform jitter. The window function may be applied by applying the window function to the signal pulse to obtain a target pulse. A linear equalizer is then generated that results in the target pulse when convolved with the signal pulse. The linear equalizer is then applied to the waveform to limit ISI for jitter measurement.

20 Claims, 10 Drawing Sheets

EQUALIZER FOR LIMITED INTERSYMBOL INTERFERENCE

CROSS-REFERENCES TO RELATED APPLICATIONS

The present application claims benefit from U.S. Provisional Patent Application Ser. No. 62/470,757, filed Mar. 13, 2017, and entitled "Equalizer For Reduced Inter Symbol Interference," which is incorporated herein by reference as if reproduced in its entirety.

TECHNICAL FIELD

This disclosure is directed to systems and methods associated with aspects of a test and measurement system, and, more particularly, to systems and methods for employing filters to reduce intersymbol interference in the test and measurement system.

BACKGROUND

Test and measurement systems are designed to receive signal inputs, e.g. from a Device Under Test (DUT), sample the signals, display the measurement results as well as processed waveforms, and render the waveforms, for example as eye diagrams. Such measurements may include jitter. Jitter is any time deviation of a signal from ideal clean system clocking. Long duration signals may be graphed or rendered by overlaying multiple sweeps of different segments of the signal data in a so called eye diagram. When a signal is rendered in an eye diagram in terms of amplitude versus time, jitter appears as horizontal variance in the signal. Signals may also include Intersymbol Interference (ISI). ISI occurs because changes in a real signal are not perfect because of physical limits such as bandwidth limits of channels. For example, a change in signal value may occur relatively quickly in high speed signaling. However, ripples may be left behind after such a change while the signal settles to a new state. ISI occurs when a ripple from a previous signal state change is present, and interferes with, a subsequent signal state change. When graphed in an eye diagram in terms of amplitude versus time, ISI may appear as a combination of horizontal variance and vertical variance, depending on the signal patterns. Jitter is commonly separated into two categories related to ISI. Correlated jitter is caused by an ISI affect when ISI causes a signal's edge crossing time to change. Uncorrelated jitter is jitter caused by sources other than ISI, such as random jitter and periodic jitter uncorrelated to ISI. ISI correlated jitter may also cause ISI uncorrelated jitter. As both uncorrelated jitter and ISI jitter cause horizontal variance in the signal, a test system may be unable to separate effects of the jitter from effects of ISI in high speed signals.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Disclosed herein is a test and measurement system configured to mitigate, that is, reduce, limit, or remove, ISI in a waveform corresponding to an input signal upon command. Once ISI has been largely limited, a user can more accurately measure uncorrelated jitter. Such a function is particularly useful when testing high speed signals with multiple signal levels, such as pulse amplitude modulation version four (PAM4). The function is also useful in limiting uncorrelated jitter from other signal formats, such as Non-Return to Zero (NRZ) modulation. ISI is mitigated by employing an ISI equalizer. The ISI equalizer is a linear equalizer that acts as an ISI limiting filter. The ISI equalizer is generated by extracting a pulse from a waveform corresponding to an input signal, for example by employing linear pulse extraction. A window function is then selected based on the shape of the pulse. The window function is selected to have a width in unit intervals (UI) corresponding to the length of the target pulse. The window function is then applied to the pulse, via point by point multiplication, to obtain a target pulse. The target pulse has a shorter length of unsettled amplitude, e.g., the ISI of the target pulse is more limited in duration. The ISI equalizer is then generated by determining a linear equalizer that, when convolved with the extracted pulse, results in the target pulse. The linear equalizer may be determined by employing a Least Mean Square (LMS) algorithm. The resulting ISI equalizer is then applied across the entire waveform to remove ISI for each pulse outside the window of the window function employed to generate the ISI equalizer.

Figure 1:
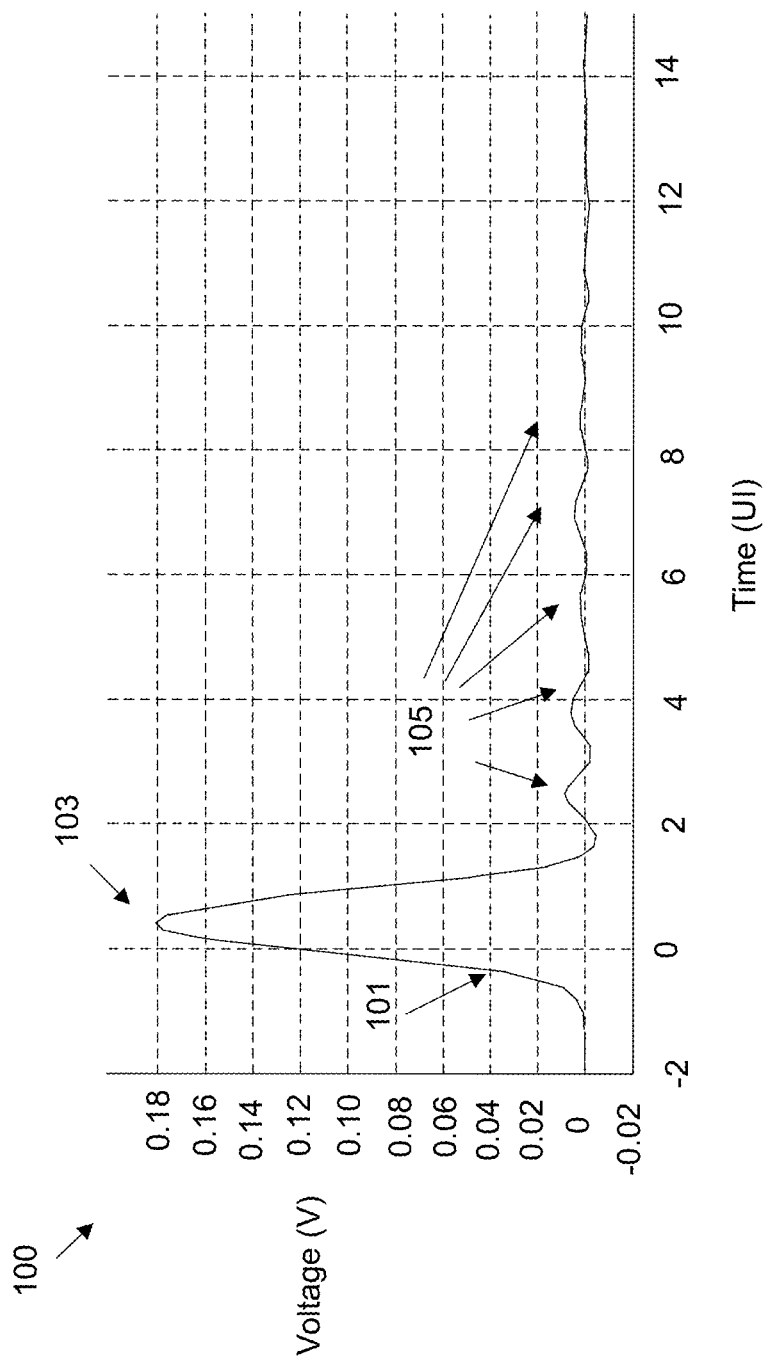
FIG. 1 is a graph of an example pulse signal exhibiting ISI.

FIG. 1 is a graph 100 of an example pulse signal exhibiting ISI. The graph 100 depicts a waveform that describes an input signal as captured by a test and measurement system, such as test and measurement system 700 described below. The graph 100 depicts the signal in terms of voltage (V) change over time as measured in the fractions of unit intervals (UI). A unit interval is the minimum time interval between condition changes of a digital data transmission signal. In other words, a UI is the amount of time needed for a digital signal value to change from representing a first symbol (e.g. modulate bit(s)) to representing a second symbol. The graph 100 depicts a single signal pulse from an input signal. It should be noted that a pulse may also be referred to as a pulse response. The pulse includes a precursor 101, a main cursor 103, and postcursors 105. As can be seen, the pulse can change value in a single UI, as the pulse is an analog signal. For example, the pulse changes from a high value at one UI to a low value by two UI. The portion of the pulse that represents the signal symbol value is the main cursor 103. The portion of the pulse that represents a change in value from a preceding value to the main cursor 103 is the precursor 101 of the pulse. The portion of the pulse that represents the time for a signal to settle back to a steady value after the main cursor 103 is the postcursor 105. The postcursor 105 contains several signal ripples that diminish over time. In the event that another pulse follows the main cursor 103, the postcursors 105 of the pulse can increase (e.g. or lower in some examples) the value of the precursor and/or even the main cursor of a subsequent pulse. ISI occurs when a first pulse alters a value of a second pulse before or after the main cursor. As can be seen by graph 100, high speed signaling may result in significant ISI as each pulse may alter one or multiple subsequent pulses. ISI can be caused by the natural response to changes in a medium, such as a communication link. ISI can also be caused by other factors such as channel loss and/or reflections resulting from a discontinuity in a communication link.

Figure 2:
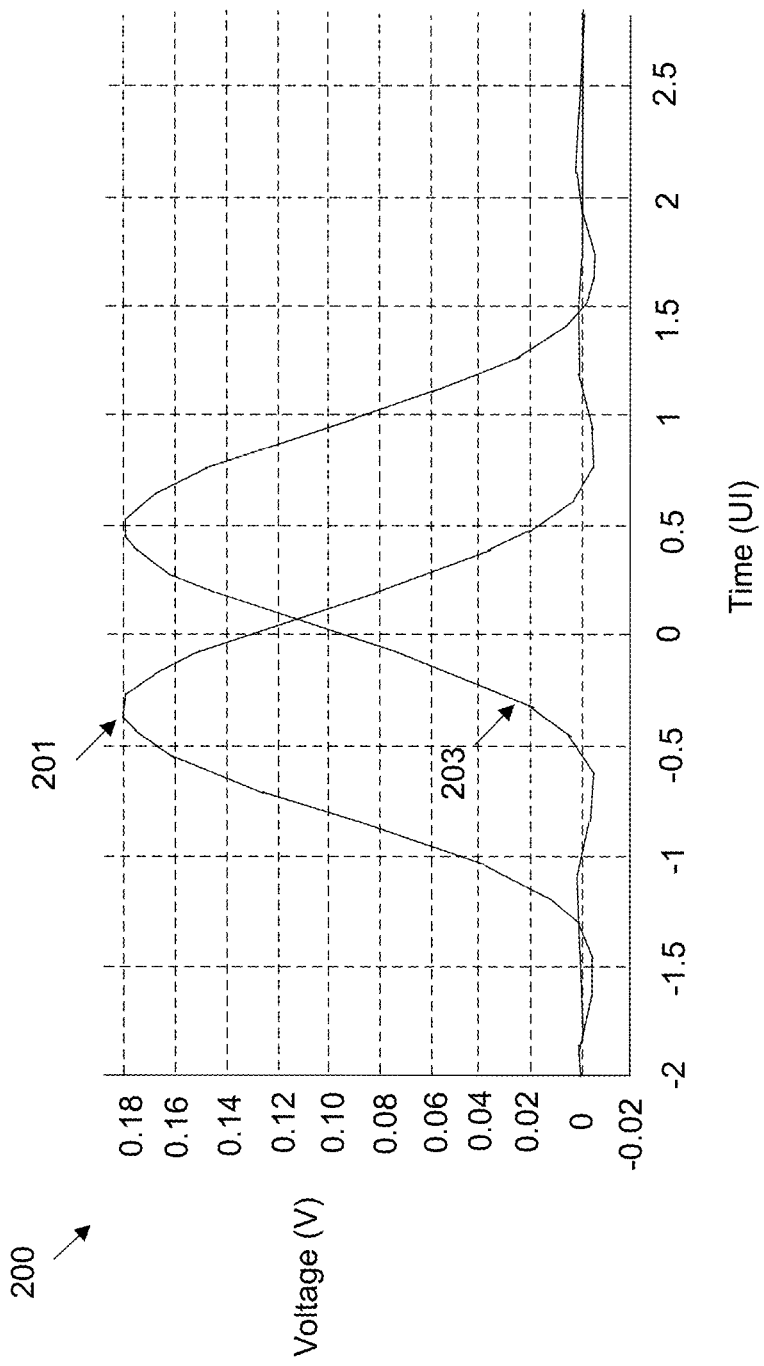
FIG. 2 is a graph of an example signal with pulses exhibiting jitter and ISI.

FIG. 2 is a graph 200 of an example signal with pulses exhibiting jitter and ISI. Graph 200 depicts a first pulse 201 and a second pulse 203 from an input signal as a function of voltage over time in IU. The pulses 201, 203 are transmitted in a periodic fashion, and hence should be exactly spaced periodically. However, the second pulse 203 is shifted horizontally from the first pulse 201, for example by one UI. The amount of the horizontal shift, when measured, indicates the jitter. The first pulse 201 and the second pulse 203, as depicted, employ a raised cosine shape in an attempt to reduce ISI. However, the jitter causes the post cursor of the first pulse 201 to increase the value of the main cursor of the second pulse 203. Specifically, the main cursor of the second pulse 203 occurs at 0.5 UI. At this point, the post cursor of the first pulse 201 is approximately 0.02V, and may increase the apparent voltage of the second pulse by the same amount. As shown by FIG. 2, ISI and jitter may interact in a manner that makes removing ISI without removing jitter difficult.

As noted above a user may wish to mitigate the impact of ISI for certain type of jitter measurements during testing. Jitter has many sources. ISI may cause ISI jitter. Further, other sources may cause certain types of uncorrelated jitter, such as periodic jitter, and/or random jitter. Also, noise can be converted to jitter through edge slopes. Such noise can come from a transmitter, from cross talk from adjacent channels, and from measurement instruments such as oscilloscopes. To perform accurate measurements, sources that could impact jitter may be considered. Determination of such jitter sources may be significantly easier when ISI is removed or limited.

Figure 3:
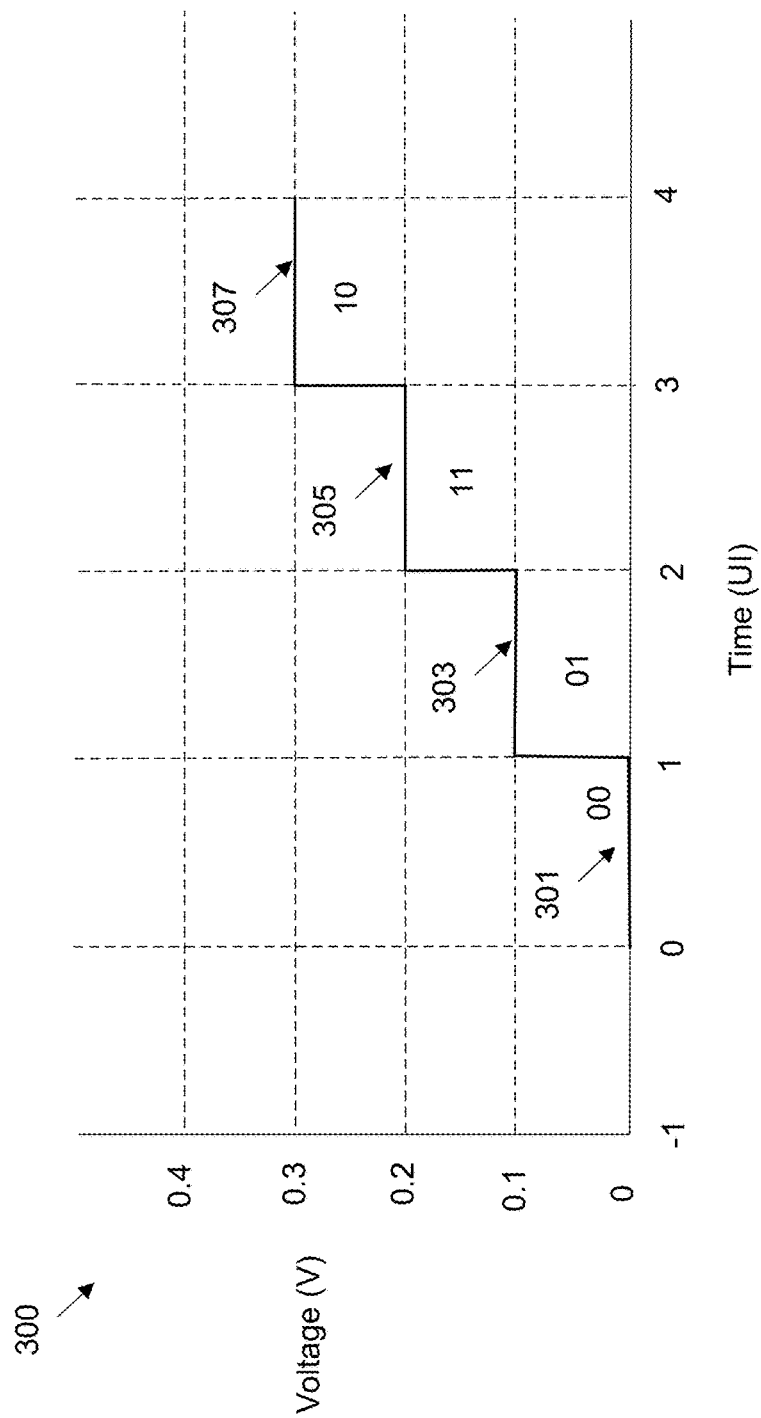
FIG. 3 is a graph of an example signal generated according to pulse amplitude modulation version four (PAM4).

FIG. 3 is a graph 300 of an example signal generated according to pulse amplitude modulation version four (PAM4) as a function of voltage over time in IU. Many signals modulation formats employ symbols that indicate a high value (e.g. a one) and a low value (e.g. a zero) in a binary scheme. PAM4 employs four levels, a first value 301, a second value 303, a third value 305, and a fourth value 307. By employing four values, a single pulse can signal two bits instead of just one. The values shown employ gray coding, which ensures that each level changes only a single bit from each adjacent level. By employing this scheme, an error in measurement, such as confusing a second value 303 for a third value 305, results in only one incorrect bit instead of two incorrect bits. The signal shown in graph 300 is a theoretical signal and does not take into account the frequency response of the communication medium or the corresponding time to adjust between values. As can be seen, a receiver of a PAM4 signal must be capable of differentiating between multiple value levels. Post cursors of an actual pulse, such as the pulse shown in FIG. 1, may add enough voltage to boost a first value 301 to a second value 303, a second value 303 to a third value 305, etc. Jitter, such as shown in FIG. 2, may also cause such errors. As such, removing or limiting ISI may be particularly useful when testing the proper operation of a PAM4 signal.

Figure 4:
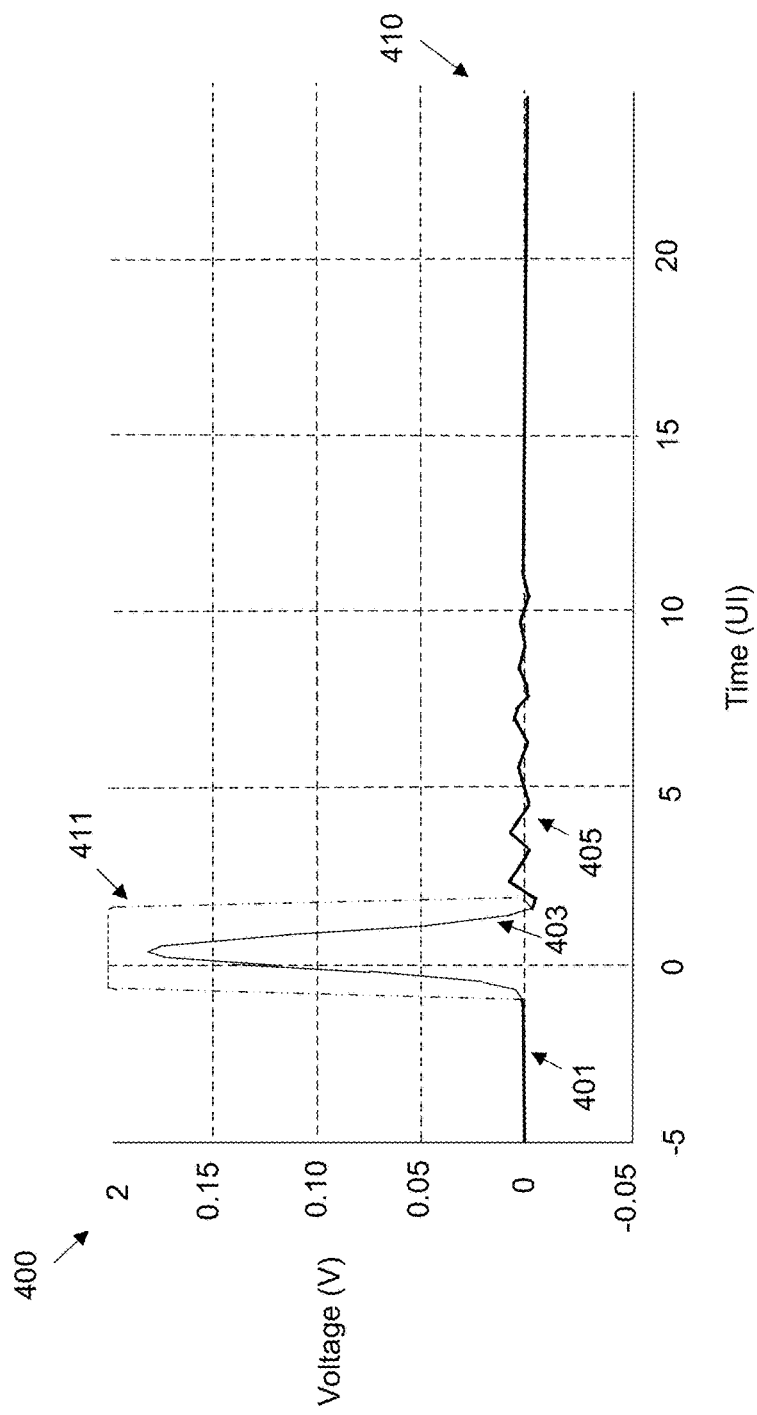
FIG. 4 is a graph of an example signal with a signal pulse with ISI mitigated by a window function.

FIG. 4 is a graph 400 of an example signal with a signal pulse 410 with ISI mitigated by a window function 411. The graph 400 depicts the signal pulse 410 as a function of voltage over time in UI. The signal pulse 410 may be any waveform generated by sampling an input signal, the shape of which is determined by a frequency response of a communication medium. As discussed above, the signal pulse 410 contains a precursor 401, a main cursor 403, and a post cursor 405, which are substantially similar to precursor 101, main cursor 103, and post cursor 105, respectively. The window function 411 is any mathematical function that is zero valued outside of a chosen interval. The window function 411 may take any shape, and is illustrated by lines with a dash and two dots. As an example, the window function 411 is depicted as a Tukey window. The window function 411 may be multiplied with the signal pulse 410. A Tukey window is a window function with a flat top, which preserves the shape of the main cursor 403 when the window function 411 is multiplied by the signal pulse 410.

As noted, the window function 411 has an interval (e.g. length) with boundaries. Beyond the boundaries, the value of the window function 411 drops to zero. When the window function 411 is multiplied by the signal pulse 410, all portions of the signal pulse 410 outside the interval are multiplied by zero and removed. The remainder of the signal pulse 410 is multiplied by a constant value (e.g. due to the flat top of the Tukey window shape), which may scale the signal pulse 410 without distorting the signal shape. The signal pulse 410 may be subsequently rescaled to compensate for the effect of the window function 411 on the portion of the signal pulse 410 inside the interval of the window function 411. However, the portions of the signal pulse 410 outside the window function 411, as shown in bold lines, are removed. A portion of the precursor 401 and most of the post cursor 405 are outside the boundaries, and hence are removed when the signal pulse is multiplied by the window function. This has the effect of limiting the ISI from the signal pulse 410.

It should be noted that the window function 410 may be selected based on the shape and length of the signal pulse 410. For example, the signal pulse 410 may be extracted via linear pulse extraction. The length of the window function 410 may be set based on the width of the signal pulse 410. As an example, the window function 410 may be set as three UI wide to include the main cursor plus some expected jitter while excluding ISI outside the three UI boundary. This ensures a signal pulse 410 has no ISI impact on any subsequent bit beyond the three UI boundary. However, the three UI boundary may be adjusted to a small number (e.g. two UI) if little jitter is present and/or larger number (e.g. four UI, five UI, etc.) if significant jitter is present and/or if spacing between symbols is larger.

Figure 5:
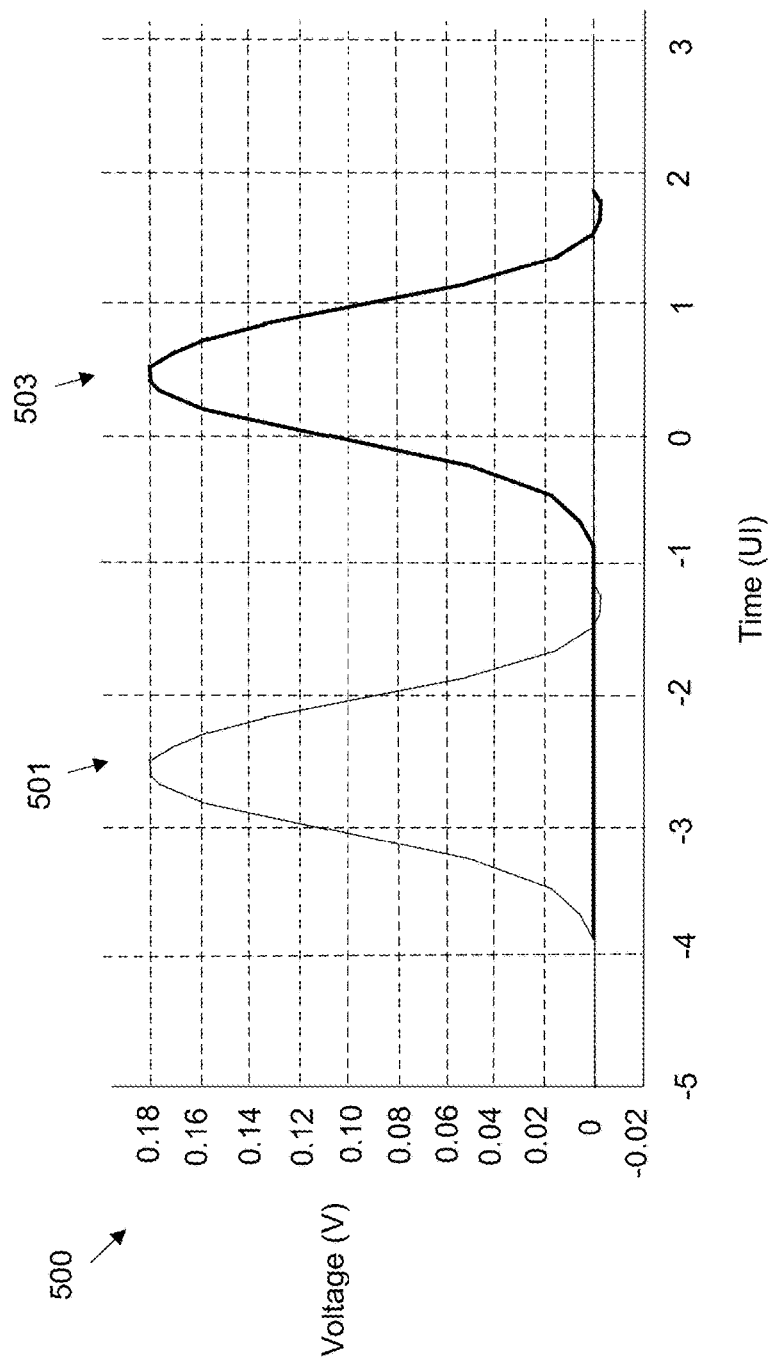
FIG. 5 is a graph of an example signal after application of an ISI equalizer.

FIG. 5 is a graph 500 of an example signal after application of an ISI equalizer, which may be determined according to the window function such as window function 411. The graph 500 depicts a first pulse 501 and a second pulse 503 as a function of voltage over time in IU. The first pulse 501 is depicted in standard laceweight and the second pulse 503 is depicted in bold line weight to distinguish the boundaries of the pulses. The first pulse 501 precedes the second pulse 503 in time, and both pulses 501 and 503 have been multiplied by a window function to remove precursors/postcursors that cause ISI. As shown, the first pulse 501 has limited, if any, effect on the second pulse 503, or vice versa. As such, the ISI is limited (e.g. significantly reduced or eliminated) by applying the window function.

Once the waveform is equalized by applying the window function, jitter measurements can be performed using a limited length of bit sequence. Further, the result may avoid ISI impact. For example, a four bit long sequence may be sufficient to determine jitter in this case when a target pulse resulting from the window function is three UI long.

Figure 6:
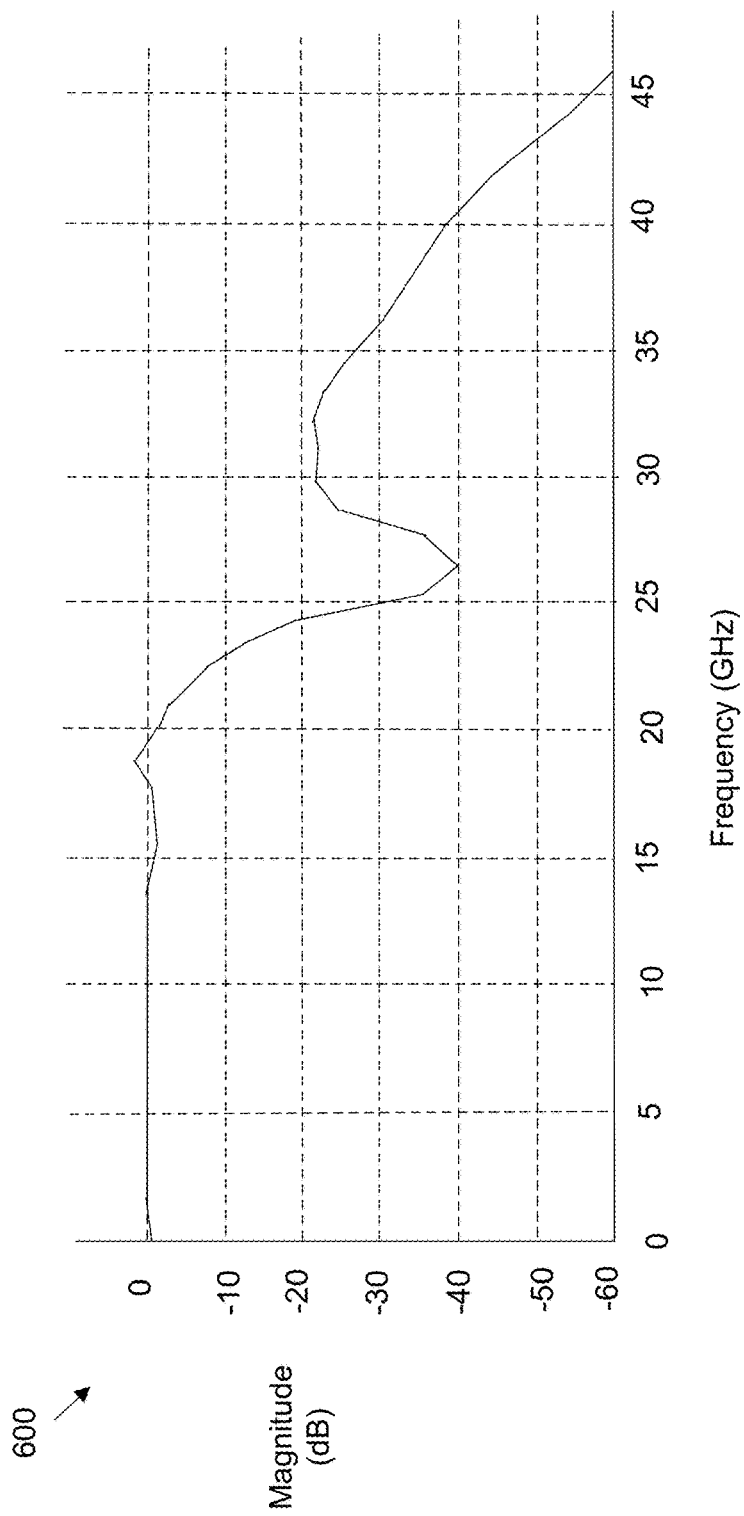
FIG. 6 is a graph of a frequency response of an example ISI equalizer.

FIG. 6 is a graph 600 of a frequency response of an example ISI equalizer, which may be determined according to a window function such as window function 411. The graph 600 depicts the magnitude of the change in Signal to Noise Ratio (SNR) of a function after application of an ISI equalizer. The change in SNR is depicted as a change in magnitude in decibels (dB) over frequency in Gigahertz (GHz). As shown, the change in SNR is almost zero from DC to about 14 GHz. The change in SNR increases slightly up to about 20 GHz, beyond which the ISI equalizer significantly changes SNR. Accordingly, the example ISI equalizer(s) discussed herein are effective in limiting ISI without increasing signal noise up to about 20 GHz. It should be noted that other methods of removing ISI, such as a raised cosine method and/or a scatter (S) parameter de-embed may increase SNR below 20 GHz. As such, the ISI equalizer is more effective at limiting ISI without increasing signal noise in the zero to twenty GHz range than other such mechanisms.

Figure 7:
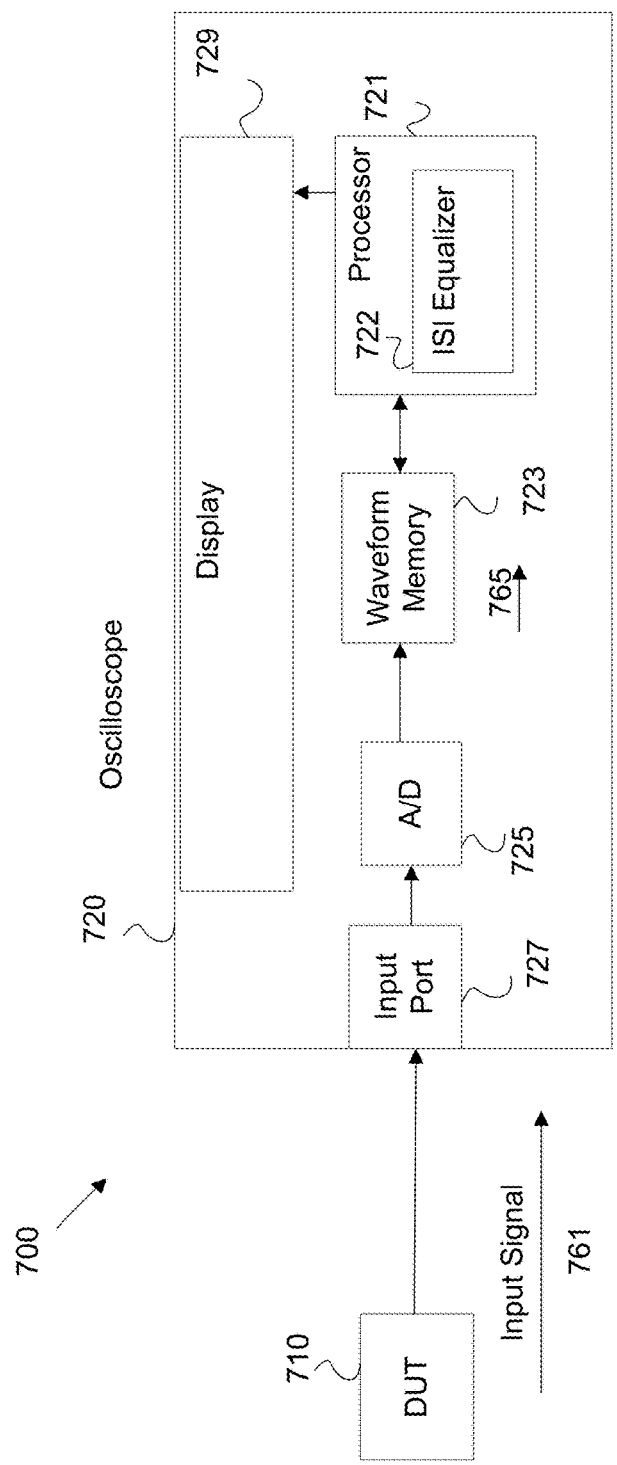
FIG. 7 is a block diagram of an example test and measurement system for generating an ISI equalizer.

FIG. 7 is a block diagram of an example test and measurement system 700 for generating an ISI equalizer, such as an ISI equalizer generated based on a window function such as window function 411. The ISI equalizer generated by system 700 may have a frequency response as shown in graph 600. Such ISI equalizer may be applied to a signal, such as a PAM4 signal shown in graph 300, and containing signal pulses as shown in graph 100 and/or 200. Such ISI equalizer may limit ISI as shown in graph 500.

The test and measurement system 700 includes an oscilloscope 720 configured to generate and apply an ISI equalizer 722 to a waveform 765. The ISI equalizer 722 is any linear equalizer that can be applied to a waveform 765 to limit (e.g. reduce or remove) ISI from the waveform 765 to support accurate jitter measurement. The oscilloscope 720 is configured to receive an input signal 761 from a device under test (DUT) 710 at an input port 727, employ an A/D converter 725 to convert the input signal 761 into a digital signal, and store the digital signal as waveform 765 in a waveform memory 723. A processor 721 then generates and applies the ISI equalizer 722 to the waveform 765 to mitigate ISI. The resulting waveform 765 having limited ISI may also be forwarded to a display 729 for display to an end user.

The DUT 710 may be any signal source configured to communicate via electrical and/or optical signals. For example, DUT 710 may include a transmitter configured to transmit signals, such as PAM4 signals, over an electrically/optically conductive medium. The DUT 710 may be coupled to the oscilloscope 720 for testing purposes, for example when the DUT 710 is believed to be engaged in transmitting faulty signals and/or for verification of signaling accuracy for a newly designed DUT 710. In some cases, the input signal 761 may be contained within the DUT 710, and may be accessed by utilizing a signal probe. The DUT 710 may be connected to the oscilloscope 720 via a DUT link. For example, the DUT link may employ electrically conductive wire, optical fiber, signal probes, intervening test equipment, etc. to communicate the input signal 761 from the DUT 710 to the oscilloscope 720.

The input signal 761 is received at the oscilloscope 720 at an input port 727. The input port 727 can be any electrical/optical components configured to interface with a DUT 710 via a link, such as, for example, a plug for receiving a signal probe. The input signal 761 is any continuous signal with a quantity (e.g. voltage, current, etc.) that varies relative to time. The oscilloscope 720 further includes a signal channel to conduct signals for testing. The signal channel can extend from the input port 727 to sampling circuitry of the oscilloscope 720. The oscilloscope 720 also includes an A/D converter 725 along the signal channel. The A/D converter 725 is configured to convert the input signal 761 from an analog format into a digital format (e.g. into a digital signal). The A/D converter 725 may convert the input signal 761 into the digital signal by sampling the input signal 761 at discrete points in time, which results in a discrete non-continuous signal. A waveform 765 may be generated as a representation of the digital signal, for example by interpolating between the discrete points in time.

The waveform 765 may be stored in waveform memory 723 for further processing. Waveform memory 723 may be any memory configured to store and retrieve waveform samples.

The waveform memory 723 may be coupled to the A/D converter 725, and may store the digital signal as the waveform 765. The waveform memory 723 may be implemented in cache memory, random access memory (RAM), read only memory (ROM), solid state drives, etc. The waveform memory 723 may forward the waveform 765, or sub-portions thereof, to a processor 721 for further processing upon request.

The processor 721 is any processing circuit configured to condition a waveform 765 for display and/or convert the waveform 765 into a desired format. The processor 721 may be implemented via one or more circuits, such as noise filters, interpolators, conversion circuits, etc. The processor 721 may be implemented in a digital signal processor (DSP), a general purpose processor, a field programmable gate array (FPGA), application specific integrated circuit (ASIC), and/or or combinations thereof. The processor 721 may be employed to generate and apply an ISI equalizer 722 to the waveform 765 in order to mitigate ISI with minimal impact on signal noise and/or jitter. The processor 721 may also implement any methods discussed herein, such as method 800.

After processing, the resulting waveform 765 having limited ISI, and/or any related filters and/or intermediate calculations may be forwarded from the processor 721 to the display 729 for presentation to a user. A display 729 is any device configured to output information in visual form. For example, the display 729 may include a digital display, a cathode ray tube, a light emitting diode (LED) display, a plasma screen display, etc. The display 729 may contain one or more graticules for displaying a waveform 765. The display 729 may be included in the oscilloscope 720, or may be a separate display (e.g. a monitor) that receives data from the oscilloscope 720 via a general purpose computer. The display 729 may display a wide variety of data, including the waveform 765 in the time domain, the waveform 765 in the frequency domain, the results of measurements, such as jitter measurements, and/or any intermediate data. It should be noted that oscilloscope 720 may also include other components to capture and display waveforms of signals, as is understood by a person of ordinary skill in the art. It will be appreciated that such components are not shown in the interest of clarity.

The process to employ system 700 to generate and apply the ISI equalizer 722 is now discussed. The input signal 761 is received via the input port 727. The input signal 761 is then converted into a waveform 765 describing the input signal by the A/D converter 725. The waveform 765 is then stored in the waveform memory 723. The processor 721 extracts a signal pulse, such as signal pulse 410, from the waveform 765. The signal pulse may be extracted from the waveform 765 by a process such as linear pulse extraction. Linear pulse extraction is a mechanism to extract the pulse response of a single signal pulse from a waveform 765 containing many pulses and signal value changes/pulses (e.g. such as a PAM 4 signal). The processor 721 then selects a window function, such as window function 411, based on a shape of the signal pulse. As discussed above, the window function may be assigned a length of N based on the width/duration of the main pulse of the signal pulse, where N is a length of a main pulse of the signal pulse. For example, the window function may be assigned a default length of three UI to correspond with a three tap transmitter equalizer applied to the input signal 765 when sampling. A three tap transmitter equalizer may have one precursor tap, one main cursor tap, and one post cursor tap, and hence N may be set to 3. As a symbol/bit can change value every UI, such a length may also be referred to as three bit periods. The length of the window function may also be altered via user input to remove more ISI or exclude less jitter as desired. For example, the window function may be assigned a length of two, four, five, six, seven, etc. bit periods/UI as desired. The window function may also be selected based on the shape of the signal pulse and/or based on user input. For example, if the user wishes to avoid altering the main cursor of the pulse when limiting ISI, a substantially square window function shape, such as a Tukey window, may be selected. However, many other window function shapes may be employed as desired.

The processor 721 may then apply the window function to the waveform 765 to remove ISI outside the window of the window function. The processor 721 may apply the window function to the waveform 765 in a multi-step process. The processor 721 first applies the window function to the signal pulse to obtain a target pulse. For example, the window function may be applied to the signal pulse by employing point by point multiplication, for example as shown in graph 400. The processor 721 then generates an ISI equalizer 722 that results in the target pulse when convolved with the extracted signal pulse. The processor 721 may then apply the ISI equalizer 722 to the entire waveform 765. Stated mathematically, the ISI equalizer 722 may be generated according to equation 1 below:

$$h_{original} * h_{equalizer} = h_{target}, \quad \text{Equation 1}$$

where $h_{original}$ denotes the signal pulse, $h_{equalizer}$ denotes the linear equalizer, $h_{target}$ denotes the target pulse, and * denotes the convolution operator. Equation 1 may be solved to generate the ISI equalizer 722 for a specified waveform 765. For example, the equation may be solved by employing a Least Mean Squares (LMS) process.

Once the equalized waveform is obtained by the processor 721, uncorrelated jitter measurements can be performed with limited number of bit sequences. For example, if N=3, a bit sequence of length four may be used to accurately determine uncorrelated jitter. Such a bit sequence may be employed when the bit sequence has two level one bits followed by two level two bits. The abovementioned process has several advantages over alternative approaches to determining jitter. One example is that the ISI equalizer 722 limits the ISI, which allows the jitter measurement to be performed without ISI. Other approaches cannot guarantee a removal of ISI as the post cursors may be in excess of six UI as shown in graph 100. The ISI equalizer 722 also mostly preserves the shape of the signal pulse within N UIs. In comparison, a raised-cosine approach and/or an S parameter de-embed approach may employ equalization targets that are set regardless of the original pulse. As a result, when the original pulse is different than the equalizer target, such an equalizer may change the waveform significantly. The impact of such an alternate equalizer on jitter is hard to quantify as such impact depends on many factors. One pitfall of the such alternate approaches is boosting noise and changing edge slopes. Such noise is translated to jitter through edge slopes. For example, a raised cosine equalizer has a upswing slope within the signal bandwidth, which indicates such equalizer may make SNR worse as a digital signal tends to have less energy in higher frequencies (e.g. above 20 GHz). In comparison, the ISI equalizer 722 has a relatively flat frequency response shape as shown in graph 600 and hence has less of an impact on SNR.

Further, application of an ISI equalizer 722 allows for faster jitter measurements compared to an approach that employs a jitter measurement on a six bit long sequence having four level one bits followed by two level two bits to minimize ISI. Such a sequence is taken from a standardized data pattern for testing certain telecommunications products known as the pseudo random binary sequence (PRBS13Q) data pattern. In this example, the ISI equalizer 722 may allow a jitter measurement to employ several four bit long sequence from PRBS13Q instead of an single six bit long sequence. PRBS13Q employs many more four bit long sequences, as described above, than the six bit long sequences with four level one bits followed by two level two bits. For the PRBS13Q data pattern, employing the four bit long sequence after applying the ISI equalizer 722 instead of the six bit sequence reduces measurement time by 30 times. This may allow a jitter measurement to complete in about two minutes instead of an hour.

As shown, an ISI limiting equalizer (e.g. ISI equalizer 722) is an efficient approach that provides more accurate jitter measurements. Such an equalizer improves the measurement speed for jitter measurements by allowing the use of shorter bit sequences after the equalizer limits the ISI. This allows accurate jitter measurements to be taken on real-time oscilloscopes in reasonable time. The approach also preserves the main pulse shape after equalization.

Figure 8:
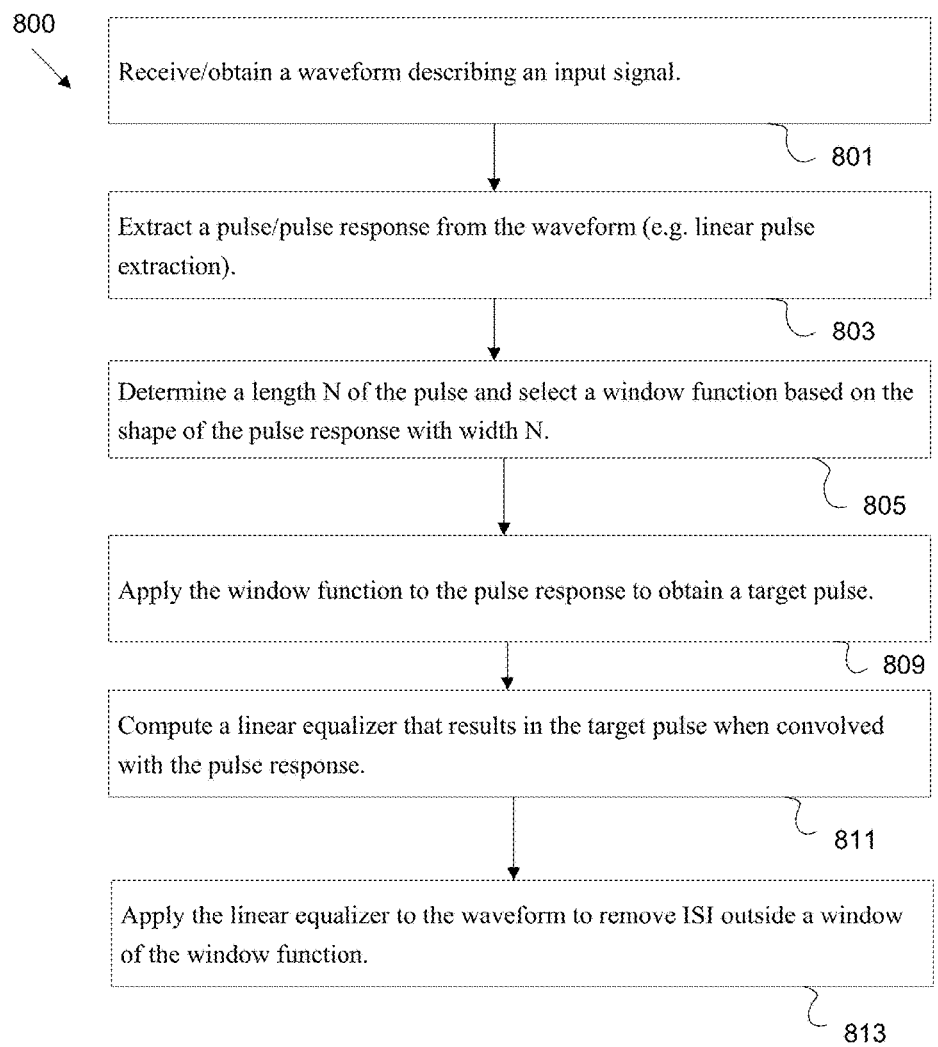
FIG. 8 is a flowchart of an example method for generating and applying an ISI equalizer.

FIG. 8 is a flowchart of an example method 800 for generating and applying an ISI equalizer, for example by employing a test and measurement system 700 to generate and apply an ISI equalizer 722. At block 801, a waveform describing an input signal is received from an input port and/or obtained from memory. The waveform may be employed by a processor as discussed above. At block 803, a pulse and/or pulse response is extracted from the waveform. The pulse/pulse response may be extracted by the processor via linear pulse extraction, for example. At block 805, a length N of the pulse is determined. Based on the length of the pulse, a window function of length N is selected. Further, the shape of the window function may also be selected based on the shape of the pulse response and/or based on user input. As noted above, the window function may be assigned a length of three bit periods (e.g. three UI)

in some examples. The window function may also be selected as a Tukey window in some examples. At block 809, the window function is applied to the pulse response to obtain a target pulse. The window function may be applied to the signal pulse by employing point by point multiplication, which may multiply all values outside of the widow function bounds by zero and hence remove them. At block 811, a linear equalizer, such as ISI equalizer 722, is computed. The linear equalizer is a filter that results in the target pulse when convolved with the pulse response. The linear equalizer may be computed by an LMS process according to equation 1 as described above. At block 813, the linear equalizer is applied to the waveform. This has the effect of removing ISI outside of a window associated with the window function.

Figure 9:
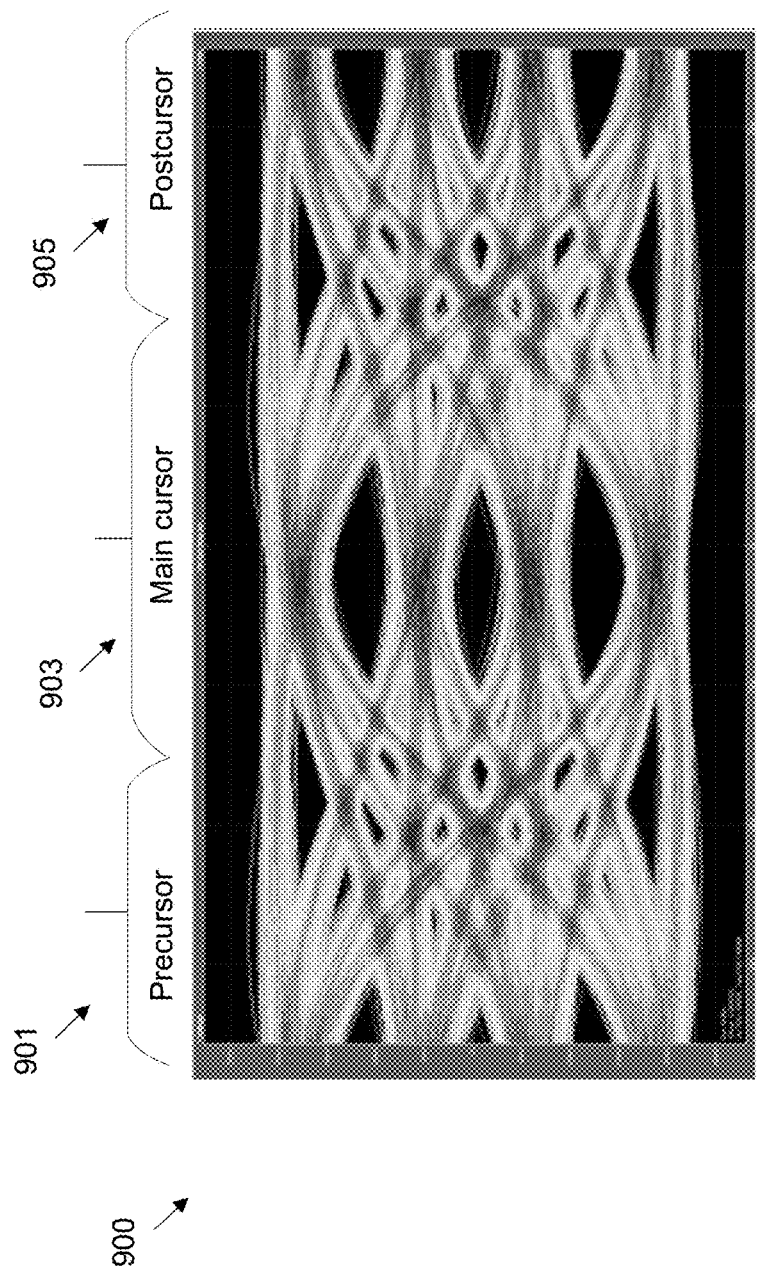
FIG. 9 is an eye diagram for a signal without application of an ISI equalizer.

FIG. 9 is an eye diagram 900 for a signal, such as input signal 761, without application of an ISI equalizer. The eye diagram 900 shows a precursor 901, a main cursor 903, and a post cursor 905 for various bit transition patterns in the input signal, all of which are overlaid onto a single graph as a heatmap. The precursor 901, main cursor 903, post cursor 905, are related to the precursor 101, the main cursor 103, and the post cursor 105.

Figure 10:
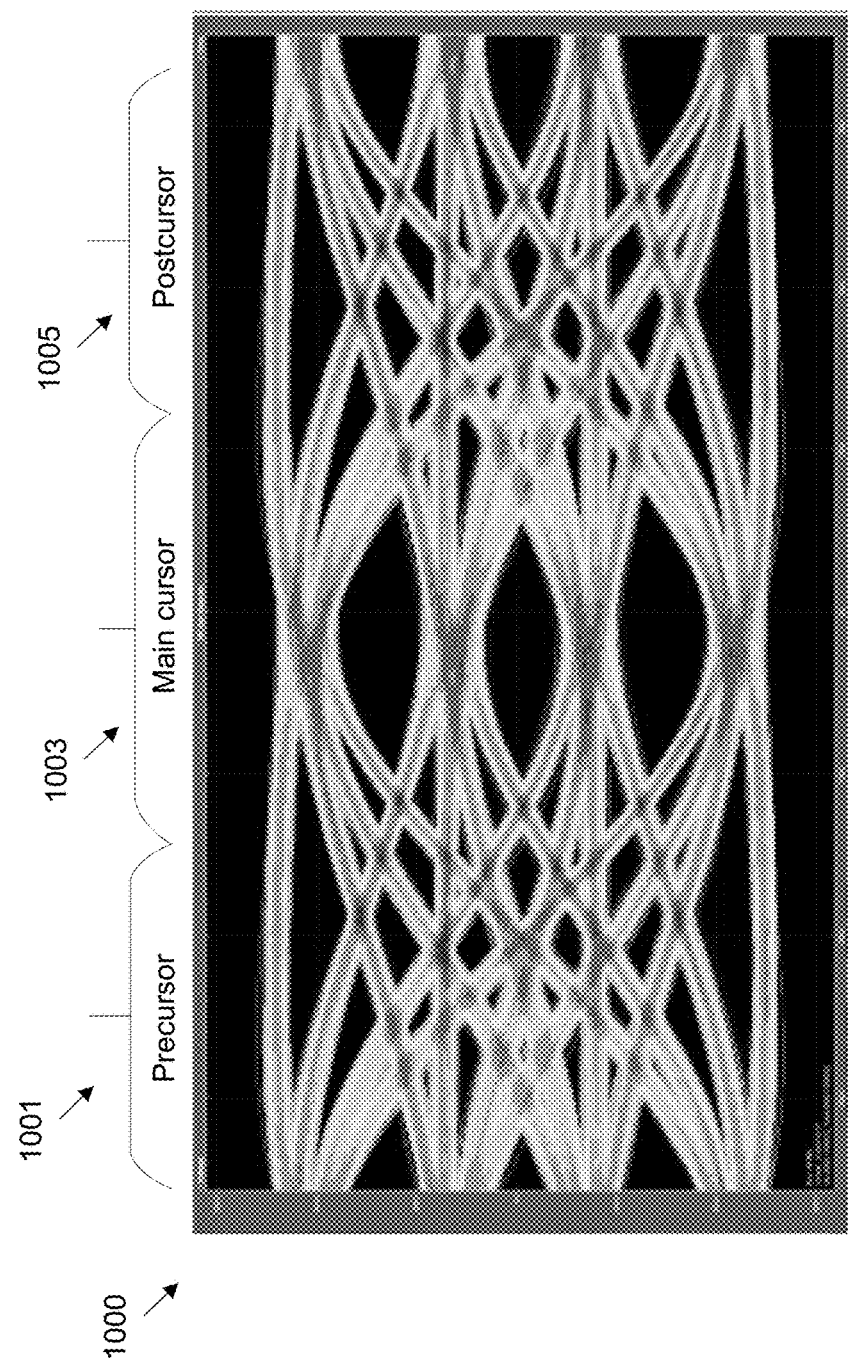
FIG. 10 is an eye diagram for a signal with application of an ISI equalizer.

FIG. 10 is an eye diagram 1000 for a signal, such as input signal 761, with application of an ISI equalizer, such as ISI equalizer 722. The eye diagram 1000 shows a precursor 1001, a main cursor 1003, and a post cursor 1005 for various bit transition patterns in the input signal in a manner substantially similar to graph 900. As can be seen by comparing graph 900 to graph 1000, the ISI equalizer thins the signal pulse lines, and hence creates more dark space in the main cursor 1003 versus the main cursor 903. As such, the ISI equalizer increases the clarity of the signal around the main cursor of the pulse. Further, the precursor 1001 and post cursor 1003 lines are significantly thinner/tighter than the precursor 901 and post cursory 903. This shows that the effect of the ISI on the precursor and post cursor portions of the signal are decreased substantially when an ISI equalizer is employed. As such, the ISI equalizer removes a significant amount of ISI from the signal, and hence makes measurement of uncorrelated jitter significantly easier and more accurate.

Examples of the invention may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes a test and measurement system comprising: an input port for receiving an input signal; a waveform memory for a waveform describing the input signal; and a processor coupled to the waveform memory, the processor configured to: extract a signal pulse from the waveform; select a window function based on a shape of the signal pulse; and apply the window function to the signal pulse to remove Intersymbol Interference (ISI) outside a window of the window function.

Example 2 includes the test and measurement system of Example 1, wherein the processor applies the window function to the signal pulse by: applying the window function to the signal pulse to obtain a target pulse; generating a linear equalizer that, when convolved with the pulse, results in the target pulse; and applying the linear equalizer to the waveform.

Example 3 the test and measurement system of Examples 1-2, wherein the window function is applied to the signal pulse by employing point by point multiplication.

Example 4 includes the test and measurement system of Examples 2-3, wherein the linear equalizer is generated according to:

$$h_{original} * h_{equalizer} = h_{target},$$

where $h_{original}$ denotes the signal pulse, $h_{equalizer}$ denotes the linear equalizer and $h_{target}$ denotes the target pulse.

Example 5 includes the test and measurement system of Examples 1-4, wherein the signal pulse is extracted from the waveform by linear pulse extraction.

Example 6 includes the test and measurement system of Examples 1-5, wherein the window function is assigned a length of three bit periods.

Example 7 includes the test and measurement system of Examples 1-6, wherein the window function is selected as a Tukey window.

Example 8 includes a method comprising: obtaining a waveform describing a signal from memory; extracting, via a processor, a signal pulse from the waveform; selecting, by the processor, a window function based on a shape of the signal pulse; and applying, by the processor, the window function to the signal pulse to remove Intersymbol Interference (ISI) outside a window of the window function.

Example 9 includes the method of Example 8, wherein the window function is applied to the signal pulse by: applying the window function to the signal pulse to obtain a target pulse; generating a linear equalizer that, when convolved with the signal pulse, results in the target pulse; and applying the linear equalizer to the waveform.

Example 10 includes the method of Example 9, wherein the window function is applied to the signal pulse by employing point by point multiplication.

Example 11 includes the method of Examples 9-10, wherein the linear equalizer is generated according to:

$$h_{original} * h_{equalizer} = h_{target},$$

where $h_{original}$ denotes the signal pulse, $h_{equalizer}$ denotes the linear equalizer and $h_{target}$ denotes the target pulse.

Example 12 includes the method of Examples 8-11, wherein the signal pulse is extracted from the waveform by linear pulse extraction.

Example 13 includes the method of Examples 8-12, wherein the window function is assigned a length of three bit periods.

Example 14 includes the method of Examples 8-13, wherein the window function is selected as a Tukey window.

Example 15 includes a non-transitory computer readable medium for storing a computer program product comprising instructions that, when executed by a processor of a test and measurement system, cause the test and measurement system to: obtain a waveform describing a signal from memory; extract a signal pulse from the waveform; select a window function based on a shape of the signal pulse; and apply the window function to the signal pulse to remove Intersymbol Interference (ISI) outside a window of the window function.

Example 16 includes the non-transitory computer readable medium of Example 15, wherein the window function is applied to the signal pulse by: applying the window function to the signal pulse to obtain a target pulse; generating a linear equalizer that, when convolved with the signal pulse, results in the target pulse; and applying the linear equalizer to the waveform.

Example 17 includes the non-transitory computer readable medium of Example 16, wherein the window function is applied to the signal pulse by employing point by point multiplication.

Example 18 includes the non-transitory computer readable medium of Examples 16-17, wherein the linear equalizer is generated according to:

$$h_{original} * h_{equalizer} = h_{target},$$

where $h_{original}$ denotes the signal pulse, $h_{equalizer}$ denotes the linear equalizer and $h_{target}$ denotes the target pulse.

Example 19 includes the non-transitory computer readable medium of Examples 15-18, wherein the window function is assigned a length of three bit periods.

Example 20 includes the non-transitory computer readable medium of Examples 15-19, wherein the window function is selected as a Tukey window.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement system comprising:
an input port for receiving an input signal;
a waveform memory for a waveform describing the input signal; and
a processor coupled to the waveform memory, the processor configured to:
extract a signal pulse from the waveform;
select a window function based on a shape of the signal pulse; and
apply the window function to the signal pulse to remove Intersymbol Interference (ISI) outside a window of the window function.

2. The test and measurement system of claim 1, wherein the processor applies the window function to the signal pulse by:
applying the window function to the signal pulse to obtain a target pulse;
generating a linear equalizer that, when convolved with the signal pulse, results in the target pulse; and
applying the linear equalizer to the waveform.

3. The test and measurement system of claim 2, wherein the window function is applied to the signal pulse by employing point by point multiplication.

4. The test and measurement system of claim 2, wherein the linear equalizer is generated according to:

$$h_{original} * h_{equalizer} = h_{target},$$

where $h_{original}$ denotes the signal pulse, $h_{equalizer}$ denotes the linear equalizer and $h_{target}$ denotes the target pulse.

5. The test and measurement system of claim 1, wherein the signal pulse is extracted from the waveform by linear pulse extraction.

6. The test and measurement system of claim 1, wherein the window function is assigned a length of three bit periods.

7. The test and measurement system of claim 1, wherein the window function is selected as a Tukey window.

8. A method comprising:
obtaining a waveform describing a signal from a memory;
extracting, via a processor, a signal pulse from the waveform;
selecting, by the processor, a window function based on a shape of the signal pulse; and
applying, by the processor, the window function to the signal pulse to remove Intersymbol Interference (ISI) outside a window of the window function.

9. The method of claim 8, wherein the window function is applied to the signal pulse by:
applying the window function to the signal pulse to obtain a target pulse;
generating a linear equalizer that, when convolved with the signal pulse, results in the target pulse; and
applying the linear equalizer to the waveform.

10. The method of claim 9, wherein the window function is applied to the signal pulse by employing point by point multiplication.

11. The method of claim 9, wherein the linear equalizer is generated according to:

$$h_{original} * h_{equalizer} = h_{target},$$

where $h_{original}$ denotes the signal pulse, $h_{equalizer}$ denotes the linear equalizer and $h_{target}$ denotes the target pulse.

12. The method of claim 8, wherein the signal pulse is extracted from the waveform by linear pulse extraction.

13. The method of claim 8, wherein the window function is assigned a length of three bit periods.

14. The method of claim 8, wherein the window function is selected as a Tukey window.

15. A non-transitory computer readable medium for storing a computer program product comprising instructions that, when executed by a processor of a test and measurement system, cause the test and measurement system to:
obtain a waveform describing a signal from a memory;
extract a signal pulse from the waveform;
select a window function based on a shape of the signal pulse; and
apply the window function to the signal pulse to remove Intersymbol Interference (ISI) outside a window of the window function.

16. The non-transitory computer readable medium of claim 15, wherein the window function is applied to the signal pulse by:
applying the window function to the signal pulse to obtain a target pulse;
generating a linear equalizer that, when convolved with the signal pulse, results in the target pulse; and
applying the linear equalizer to the waveform.

17. The non-transitory computer readable medium of claim 16, wherein the window function is applied to the signal pulse by employing point by point multiplication.

18. The non-transitory computer readable medium of claim 16, wherein the linear equalizer is generated according to:

$$h_{original} * h_{equalizer} = h_{target},$$

where $h_{original}$ denotes the signal pulse, $h_{equalizer}$ denotes the linear equalizer and $h_{target}$ denotes the target pulse.

19. The non-transitory computer readable medium of claim 15, wherein the window function is assigned a length of three bit periods.

20. The non-transitory computer readable medium of claim 15, wherein the window function is selected as a Tukey window.

* * * * *